United States Patent
Bojko

(12) 
(10) Patent No.: US 6,492,094 B1
(45) Date of Patent: Dec. 10, 2002

(54) LITHOGRAPHY FOR FAST PROCESSING OF LARGE AREAS UTILIZING ELECTRON BEAM EXPOSURE

(75) Inventor: Richard Joseph Bojko, Minneapolis, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 13 days.

(21) Appl. No.: 09/839,197

(22) Filed: Apr. 19, 2001

Related U.S. Application Data

(60) Provisional application No. 60/198,606, filed on Apr. 19, 2000, and provisional application No. 60/198,609, filed on Apr. 19, 2000.

(51) Int. Cl.$^7$ .................................................. G03C 5/00
(52) U.S. Cl. ........................ 430/296; 430/328; 430/942
(58) Field of Search ................................ 430/296, 328, 430/942

(56) References Cited

U.S. PATENT DOCUMENTS

| | | | |
|---|---|---|---|
| 5,994,030 A | 11/1999 | Sugihara et al. | 430/296 |
| 6,020,107 A | 2/2000 | Niiyama et al. | 430/296 |

OTHER PUBLICATIONS

Clifford L. Henderson, *Introduction to Electron Beam Lithography*, Georgia Institute of Technology School of Chemical Engineering, (http://dot.che.gatech.edu/henderson/introduction_to_electron_beam_lithography.htm), pp. 1–12.

Clifford L. Henderson, *Lithography Overview*, Georgia Institute of Technology School of Chemical Engineering, (http://dot.che.gatech.edu/henderson/new_page_5.htm), pp. 1–3.

Clifford L. Henderson, *Introduction to Microelectronics and Microlithograpy*, Georgia Institute of Technology School of Chemical Engineering, (http://dot.che.gatech.edu/henderson/introduction_to_lithography.htm), pp. 1–12.

Research, *Photolithography*, Georgia Institute of Technology School of Chemical Engineering, (http://www.ece.gatech.edu/research/labs/vc/theory/photolith.html), pp. 1–4.

E. Paul Degarmo Et Al., *Materials and Processes in Manufacturing*, (1988) pp. 860–861, 1001–1006, $7^{th}$ Edition, Macmillan Publishing Company, NY, USA.

*Primary Examiner*—Christopher G. Young
(74) *Attorney, Agent, or Firm*—Robert P. Lenart; Pietragallo, Bosick & Gordon

(57) ABSTRACT

A lithography method combines both high gap resolution and high processing speed. An electron beam sensitive resist is applied to a substrate, followed by a photoresist. The undesired portions of the photoresist are removed through photolithography. An electron beam flood exposure or oxygen ashing is used to remove those portions of the electron beam sensitive resist not protected by the photoresist. An optical flood is used to remove the remaining photoresist. Electron beam lithography is then used to define narrow gaps within the remaining electron beam sensitive resist.

11 Claims, 4 Drawing Sheets

LITHOGRAPHY FOR FAST PROCESSING OF LARGE AREAS UTILIZING ELECTRON BEAM EXPOSURE

CROSS REFERENCE TO RELATED APPLICATION

This application claims the benefit of U.S. Provisional Patent Application Nos. 60/198,606, filed Apr. 19, 2000 and Ser. No. 60/198,609, filed Apr. 19, 2000.

BACKGROUND OF THE INVENTION

1. Field of the Invention

The present invention relates to a lithography method for processing large surface areas of microelectric devices. More specifically, the present invention provides a means for quickly processing large surface areas while maintaining high resolution.

2. Description of the Related Art

Microelectronic components are frequently processed using photolithography or electron beam lithography to define the surface area for which a milling, such as ion milling, etching, or doping operation will be subsequently performed. Such processes typically involve placing a shield over a surface of the components, and then removing portions of that shield located over sections wherein the subsequent operation is to be performed.

Photolithography typically utilizes ultraviolet light to define those portions of the protective covering to be removed, and to remain in place. The shielding substance is known as a photoresist. Photoresists come in two types: negative and positive. A positive photoresist degrades upon exposure to ultraviolet light, and a negative photoresist will undergo crosslinking of the polymer molecules within the photoresist upon exposure to UV light, so that the unexposed portions are easier to remove. Positive photoresists are more commonly used because they have superior gap resolution. The photolithography process involves spinning the polymer photoresist across the entire surface of the component to be processed, placing a mask with transparent and opaque portions over the photoresist, so that the desired portions of a positive photoresist (or undesired portions of a negative photo resist) are covered by the opaque portions. The photoresist is exposed to ultraviolet light through the mask, thereby causing a positive photoresist under the transparent portions of the mask to deteriorate, facilitating removal (or causing the portions of a negative photoresist under the transparent portions of a mask to undergo crosslinking of polymer molecules, facilitating removal of the unexposed photoresist). The mask is then removed, and a solvent capable of removing only the weaker portions of the photoresist is applied, thereby leaving photoresist over only those surfaces which must remain covered. The entire surface may then be subjected to a milling, etching, or doping process, with only the uncovered portions of the substrate actually undergoing the process. Although photolithography is a rapid process, the gap resolution attainable is limited, and is generally a function of the wavelength of the light used to affect the photoresist. For purposes of this application, the term gap resolution is defined as the ability to precisely expose only desired portions of the substrate. As light is traveling through the transparent portions of the mask, those portions of the light with a smaller wavelength will undergo greater refraction.

For creating extremely fine patterns, electron beam lithography is presently used. As in photolithography, electron beam lithography utilizes a substance known as a resist to cover a substrate, and then uses an electron beam to define those portions of the resist to be removed. A positive resist deteriorates upon exposure to the electron beam, and a negative resist hardens upon exposure to the electron beam, thereby facilitating removal of the unexposed portions. Electron beam lithography is frequently performed by directing the electron beam sequentially, on a pixel by pixel basis, across those portions of the resist for which exposure is desired. This is an extremely slow process.

Hybrid lithography is another presently available process, wherein both electron beam and optical lithography are performed using a single layer of resist. This process requires selection of a resist that is sensitive to both optical exposure and electron beam exposure, substantially limiting the available resist materials. Additionally, this process requires the use of equipment configured to expose the resist to appropriate, compatible wavelengths, greatly increasing equipment expenses.

Accordingly, there is a need for a lithography process having high resolution, but capable of being performed at a significantly faster rate.

SUMMARY OF THE INVENTION

The present invention is a lithography process, having the high resolution of electron beam lithography, which may be used to define narrow gaps, while providing the speed of photolithography for processing large surface areas.

The surface of a substrate for which lithography is desired is covered with an electron beam sensitive resist. The electron beam sensitive resist is covered with a photoresist. Both resists will typically be of the positive type, although negative resists may be used. A mask is placed over the photoresist, and the photoresist is exposed to radiation (most commonly ultraviolet light) through the transparent portions of the mask. The undesired portions of the photoresist are then removed by the appropriate solvent. At this point, a portion of the electron beam sensitive resist is shielded by the remaining photoresist.

An electron beam flood is applied to entire surface being processed. The undesired electron beam resist may then be removed by the appropriate solvent. Applying an optical flood to the entire surface removes the remaining photoresist, thereby exposing the entire surface of the remaining electron beam resist. At this point in the process, large areas of the substrate have been exposed with little processing time. Electron beam lithography may then be applied sequentially across the remaining electron beam resist, thereby permitting the creation of narrow gaps and precisely defined edges within the remaining resist. Because only a small portion of resist is removed through sequentially applied electron beams, the affect of this step on the overall processing time is minimized. At this point, the substrate may be subjected to a further processing, such as ion milling, etching, or doping process, with the electron beam sensitive resist protecting those portions of the substrate for which such processing is not desired.

This lithography process combines the advantages of other types of lithography while avoiding the disadvantages of the prior art. The lithography process of the present invention specifically utilizes process steps capable of being performed rapidly to expose large areas of the substrate, thereby reducing the time required for the overall process. Additionally, process steps capable of defining gaps and edges with high resolution are used only to expose smaller areas of the substrate, thereby increasing the precision of the overall process without substantially impacting the overall time necessary to complete the improved lithography process. Therefore, unlike prior lithography processes, the lithography process of the present invention does not require choosing between high resolution and rapid processing.

It is therefore an aspect of the present invention to provide a lithography process having high gap resolution.

It is another aspect of the present invention to provide a lithography process capable of being performed quickly.

It is a further aspect of the present invention to utilize electron beam floods, optical floods, and/or oxygen ashing to remove resists from larger surface areas, and electron beam lithography to remove resists from small surface areas.

These and other aspects of the present invention will become more apparent through the following description and drawings.

BRIEF DESCRIPTION OF THE DRAWINGS

Like reference numbers denote like elements throughout the drawings.

DETAILED DESCRIPTION OF THE EMBODIMENTS OF THE PRESENT INVENTION

The present invention is an improved lithography process, exhibiting high resolution for defining narrow gaps, and high processing speed for rapid processing of large surface areas. Although not limited to such use, the lithography process of the present invention is particularly useful for rapid and accurate processing of microelectronic components. The lithography process will provide a precisely defined surface area upon which a subsequent process may be performed.

Figure 1:
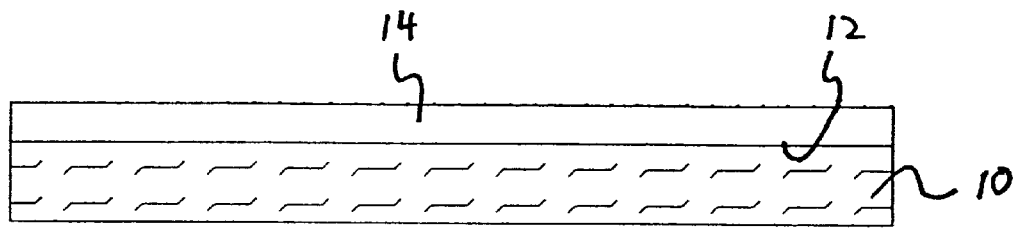
FIG. 1 is a cross sectional view of a substrate to which an electron beam sensitive resist layer has been applied.

The lithography process of the present invention is illustrated in FIGS. 1–11. In FIG. 1, a substrate 10 has been provided, upon which lithography will be performed. The substrate 10 may be any of several commonly known materials existing within microelectronic components, for example, silicon, ferromagnetic materials such as combinations of iron, nickel, and cobalt, electroconductive material such as gold or copper, and/or gap and insulating materials such as alumina or thermally cured photoresist. The substrate 10 includes a surface 12, upon which a manufacturing process is to be performed. The manufacturing process may be any process for which it is desirable to shield a portion of the surface 12 from the process, while subjecting another portion of the surface 12 to the process. Examples of such manufacturing processes include milling, such as ion milling, etching, doping, such as doping a silicon substrate with boron or phosphorus, forming additional structures on the substrate, for example, by depositing, sputtering, or plating additional material, and/or chemical mechanical polishing.

Processing the surface 12 begins by applying a resist to the surface 12. In the present example, an electron beam sensitive resist 14 has been applied to the surface 12 in FIG. 1. A resist is typically applied by a process known as spinning (rotating the substrate at high speed to uniformly distribute the resist across its surface), and will cover the entire surface 12. The electron beam sensitive resist 14 may be either a positive type resist (which deteriorates upon exposure to an electron beam) or a negative type resist (which hardens upon exposure to an electron beam). Positive type resists include PMMA, EBR-9, PBS, ZEP, and AZ5206. Examples of negative type resists include COP, and SAL-606. The example illustrated in the figures utilizes a positive electron beam sensitive resist 14.

Figure 2:
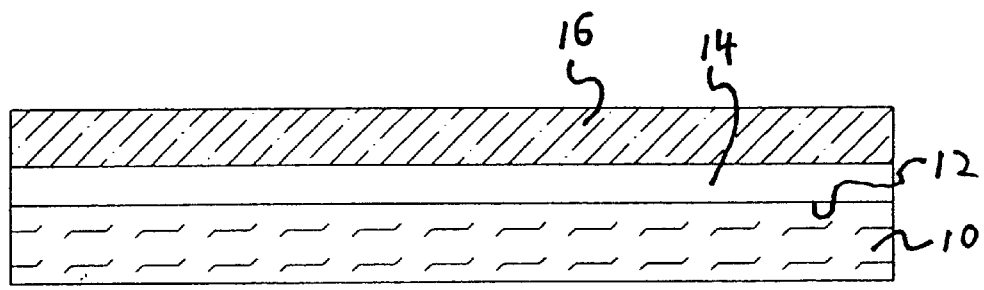
FIG. 2 is a cross sectional view of a substrate to which an electron beam sensitive resist and a photoresist have been applied.

Referring to FIG. 2, the electron beam sensitive resist 14 has been covered by a photoresist 16. The photoresist 16 is also applied by spinning, and covers the entire electron beam sensitive resist 14. The photoresist 16 may be of either the positive type (which deteriorates upon exposure to radiation) or the negative type (which undergoes polymer crosslinking upon exposure to radiation), although the present example illustrates the use of a positive type photoresist 16. An example of such a photoresist is AZ.

Figure 3:
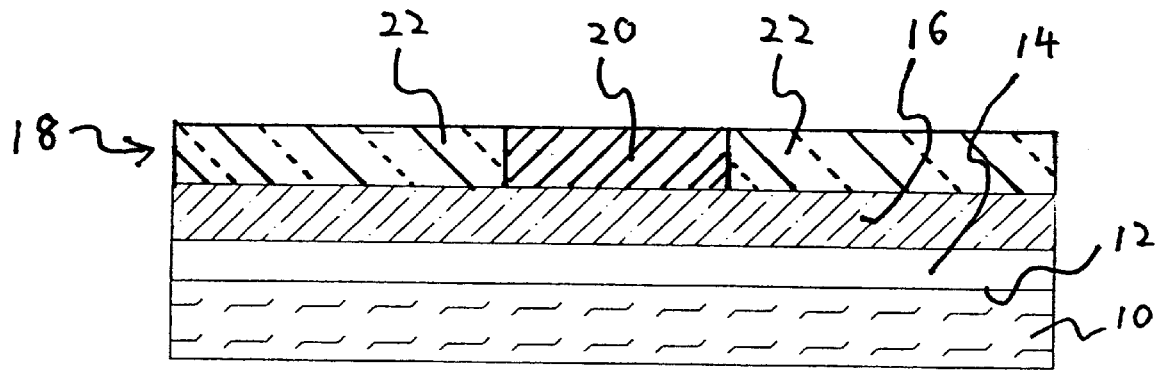
FIG. 3 is a cross sectional view of a substrate to which both an electron beam sensitive resist and a photoresist have been applied, having a mask above the photoresist.
Figure 4:
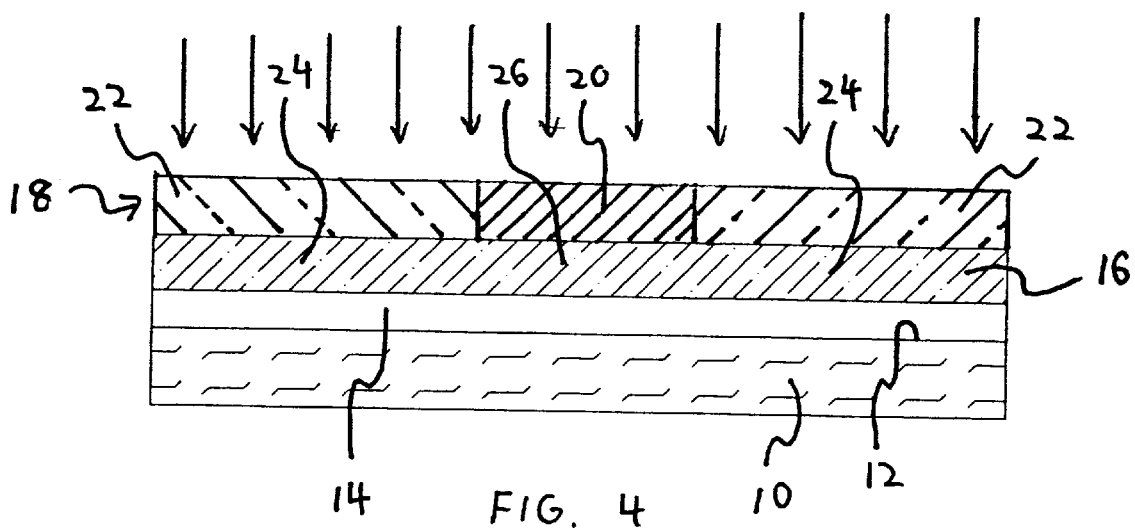
FIG. 4 is a cross sectional view of a substrate to which an electron beam sensitive resist and photoresist have been applied, undergoing photolithography.

Referring to FIG. 3, a mask 18 covers the photoresist 16. The mask 18 includes an opaque portion 20 and a transparent portion 22. When radiation such as light, typically ultraviolet light, is applied to the photoresist 16 through the mask 18 as illustrated in FIG. 4, the photoresist 16 will have an exposed portion 24 and an unexposed portion 26. Because the photoresist 16 in the present example is a positive type photoresist, the exposed portion 24 will deteriorate upon exposure to the ultraviolet light, while the unexposed portion 26 will be unaffected.

Figure 5:
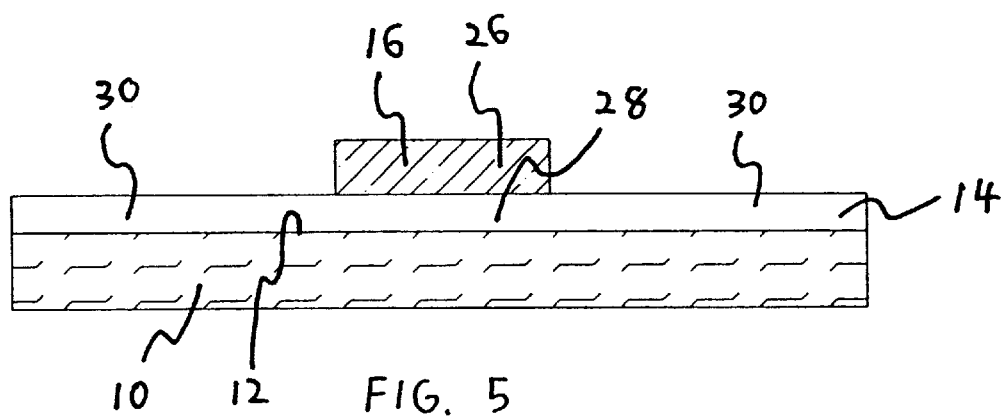
FIG. 5 is a cross sectional view of a substrate having an electron beam sensitive resist and the remaining photoresist after photolithography.

Referring to FIG. 5, the mask 18 has been removed, and the photoresist 16 has been exposed to a solvent, typically an aqueous alkaline solution such as potassium hydroxide or tetra-methyl ammonium hydroxide, that has removed the exposed portion 24, leaving only the unexposed portion 26. The unexposed portion 26 of the photoresist 16 thereby forms a shield over a covered portion 28 of the electron beam sensitive resist 14, leaving an uncovered portion 30 of the electron beam sensitive resist 14 exposed to a subsequent process.

Figure 6:
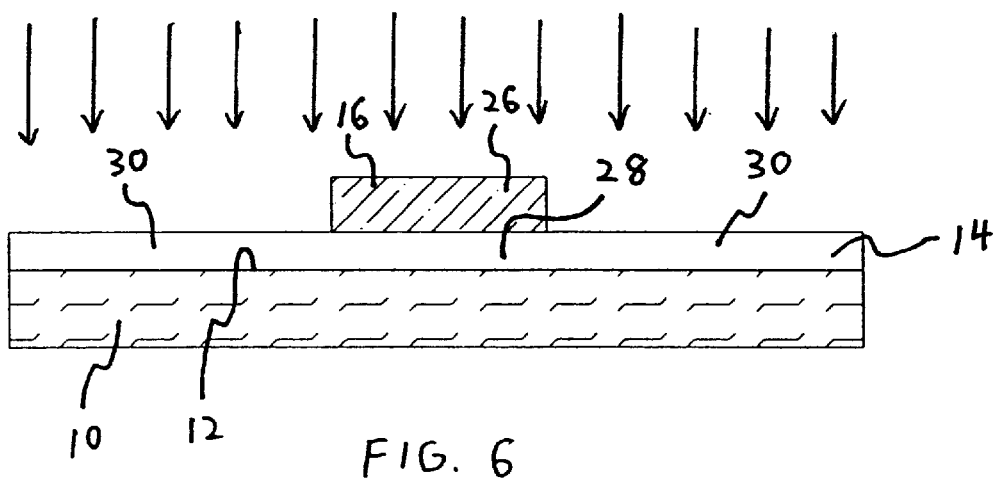
FIG. 6 is a cross sectional view of a substrate of FIG. 5 undergoing exposure to an electron beam flood.

FIG. 6 illustrates the first step in the removal of the uncovered portions 30 of the electron beam sensitive resist 14. Initially, the undesired portions of the electron beam sensitive resist 14 must be made weaker than the desired portions to facilitate removal. Because the present example illustrates a positive type electron beam sensitive resist 14, the uncovered portion 30 is the undesired portion. Exposure to an electron beam flood, which is a broad-beam of unfocussed electrons, causes the uncovered portions 30 to deteriorate. The uncovered portion 30 of the electron beam sensitive resist 14 is then exposed to a solvent adapted to remove deteriorated electron beam sensitive resist, resulting in the remaining resists illustrated in FIG. 7. Examples of such solvents include MIBK:IPA, MIAK:2-pentanone 3:1, xylene:p dioxane, KLK PPD 401, MEK:ethanol 7:3, and MF312:water. Those portions of the surface 12 of the substrate 10 for which a large surface area must be exposed, denoted by the reference number 32, are now exposed for further processing.

Figure 7:
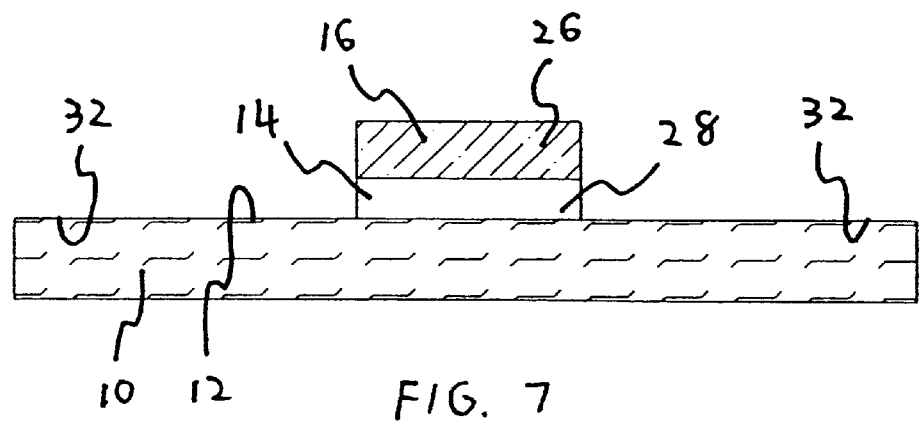
FIG. 7 is a cross sectional view of a substrate having the electron beam sensitive resist and photoresist remaining after application of an electron beam flood.

An alternative method of removing the uncovered portions 30 of the electron beam resist is to use an Oxygen Ashing technique, such as a barrel asher or parallel plate oxygen ion etching setup, to physically etch away the material. In any of a variety of related processes, including but not limited to oxygen ashing, reactive ion etching, reactive ion beam etching, plasma etching, or parallel plate plasma etching, a reactive ionic species, most commonly oxygen, is used to chemically etch exposed surfaces, such as the uncovered portions 30 of the electron beam resist. Note that in this technique, the remaining photoresist 16 is also removed simultaneously with the uncovered portions 30 of the electron beam resist. Therefore, the Oxygen Ashing process begins as illustrated in FIG. 6, and removes both the remaining photoresist 16 and uncovered electron beam resist portions 30. In the envisaged process, the photoresist used is of a thicker film than the electron beam resist. Therefore, the uncovered electron beam resist portions 30 will be completely removed while some of the photoresist 16 will remain, as illustrated in FIG. 7. This ensures that the covered electron beam resist portion 28 will remain on the substrate 10, so this lack of selective nature of this etching technique is not a critical factor.

Figure 8:
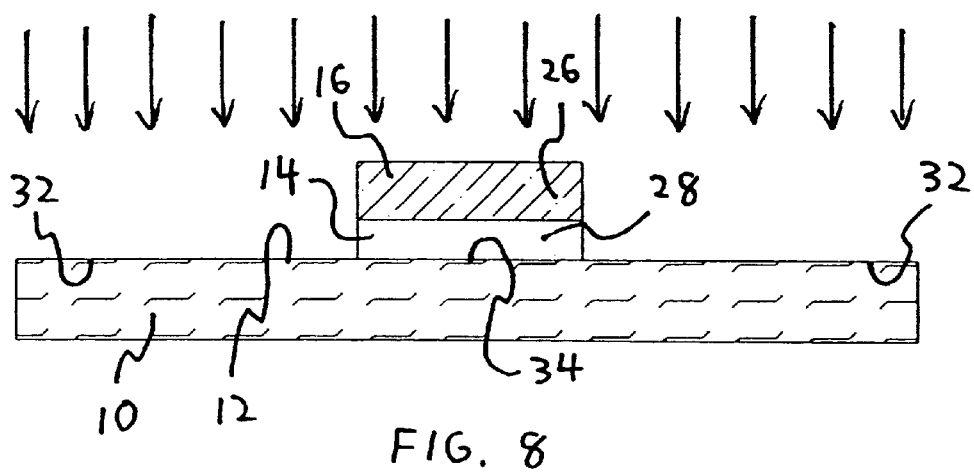
FIG. 8 is a cross sectional view of a substrate, remaining electron beam sensitive resist, and remaining photoresist undergoing an optical flood.
Figure 9:
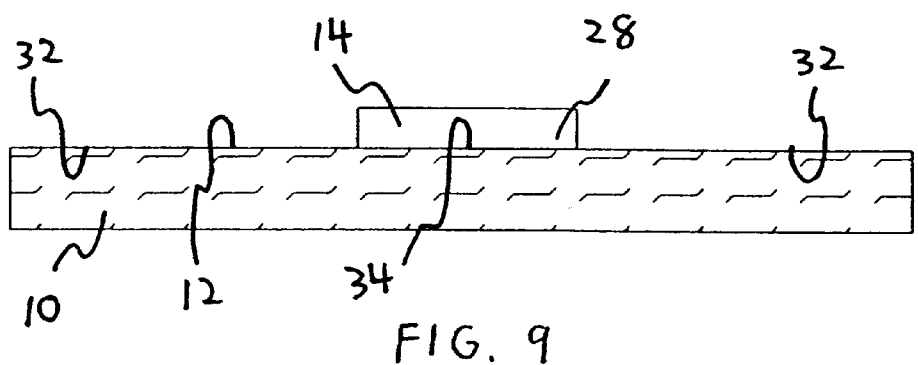
FIG. 9 is a cross sectional view of a substrate with remaining electron beam sensitive resist.

Referring to FIG. 8, the remaining photoresist 16 is removed by exposing it to an optical flood to cause deterioration, followed by application of the appropriate solvent to remove the deteriorated photoresist 16. For purposes of this description, an optical flood is defined as a broad, unfocused beam of optical radiation, for example, ultraviolet light. At this point, as illustrated in FIG. 9, the only portion of the surface 12 of the substrate 10 covered by the electron beam sensitive resist 14 is the covered portion 34, for which only small portions of the surface area must be exposed. At this point, large areas of the substrate 10 have been exposed using process steps capable of exposing these areas very quickly, thereby minimizing the total processing time.

Figure 10:
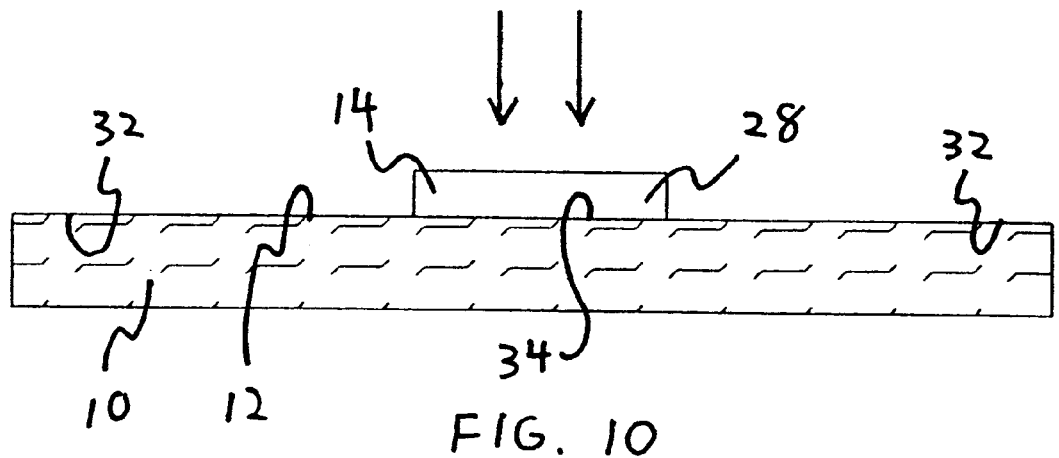
FIG. 10 is a cross sectional view of a substrate with remaining electron beam sensitive resist undergoing electron beam lithography.
Figure 11:
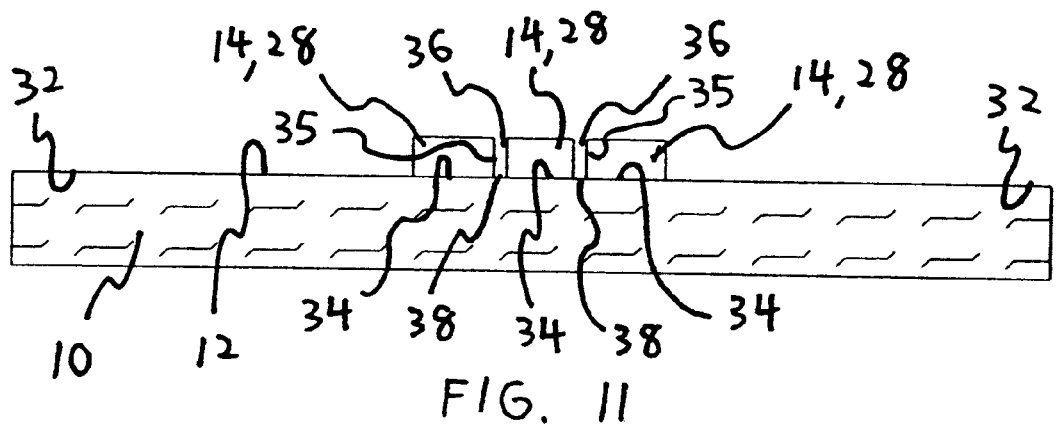
FIG. 11 is a cross sectional view of a substrate with electron beam sensitive resist after electron beam lithography.

Referring to FIG. 10, an electron beam is applied to the remaining photoresist 14, being directed sequentially to specific portions of the electron beam sensitive resist 14 that must be removed. The edges 35 illustrated in FIG. 11 may be very precisely defined, and therefore the resulting gaps 36 in the photoresist 14 may be quite narrow, due to the high resolution of this process. The gaps 36 may be at least as narrow as 20 nm if desired. FIG. 11 illustrates the final results of the lithography process, wherein large surface areas 32 of the surface 12 have been exposed through process steps that remove large amounts of the photoresist 14 in small time intervals, and the smaller, more precisely defined portions 38 of the surface 12, exposed by the gaps 36 in the electron beam sensitive resist 14, have been exposed by a process permitting the gaps 36 to be very precisely defined. The substrate 10 has now been properly prepared for subsequent processing steps, which will affect the portions 32, 38 of the surface 12 without affecting the covered portions 34 of the surface 12.

While a specific embodiment of the invention has been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A method of lithography, comprising the steps of:

providing a substrate having a surface;

covering said surface with an electron beam sensitive resist;

covering said electron beam sensitive resist with a photoresist;

exposing a portion of said photoresist to radiation, defining an exposed photoresist portion and an unexposed photoresist portion;

removing one of said photoresist portions, thereby defining a covered electron beam sensitive resist portion and an uncovered electron beam sensitive resist portion;

removing one of said electron beam sensitive resist portions, thereby defining a remaining electron beam sensitive resist portion;

removing said photoresist; and exposing a portion of the remaining electron beam sensitive resist portion to an electron beam, to define at least one gap within said remaining electron beam sensitive resist portion.

2. The lithographic process according to claim 1, wherein said photoresist is a positive type resist.

3. The lithographic process according to claim 2, wherein said step of removing one of said photoresist portions is performed by removing said exposed photoresist portion.

4. The lithographic process according to claim 1, wherein said electron beam sensitive resist is a positive type resist.

5. The lithographic process according to claim 4, wherein said step of removing one of said electron beam sensitive resist portions further comprises the steps of:

exposing said uncovered electron beam sensitive resist portion to a radiation adapted to cause deterioration of said uncovered electron beam sensitive resist portion; and exposing said uncovered electron beam sensitive resist portion to a solvent adapted to remove said uncovered electron beam sensitive resist portion.

6. The lithographic process according to claim 5, wherein said radiation is an electron beam flood.

7. The lithographic process according to claim 5, wherein said radiation is supplied by an oxygen ashing process.

8. The lithographic process according to claim 1, wherein said step of removing one of said electron beam sensitive resist portions includes an electron beam flood.

9. The lithographic process according to claim 1, wherein said step of removing one of said electron beam sensitive resist portions includes by oxygen ashing.

10. A microelectric component made according to the process of claim 1.

11. The lithographic process of claim 1, wherein the photoresist has a thickness greater than a thickness of the electron beam sensitive resist.

* * * * *